(12) United States Patent
Lang et al.

(10) Patent No.: US 8,848,945 B2
(45) Date of Patent: Sep. 30, 2014

(54) AUDIO AMPLIFIER WITH CLOSED-LOOP POWER

(75) Inventors: Yunping Lang, Hangzhou (CN); Huijie Zhao, Hangzhou (CN); Huafei Ding, Hangzhou (CN)

(73) Assignee: Monolithic Power Systems, Inc., San Jose, CA (US)

( * ) Notice: Subject to any disclaimer, the term of this patent is extended or adjusted under 35 U.S.C. 154(b) by 661 days.

(21) Appl. No.: 13/158,145

(22) Filed: Jun. 10, 2011

(65) Prior Publication Data

US 2011/0305353 A1 Dec. 15, 2011

(30) Foreign Application Priority Data

Jun. 11, 2010 (CN) .......................... 2010 1 0198972

(51) Int. Cl.
*H03F 99/00* (2009.01)
*H03F 3/217* (2006.01)
*H03F 1/30* (2006.01)

(52) U.S. Cl.
CPC .................. *H03F 3/217* (2013.01); *H03F 1/30* (2013.01); *H03F 2200/351* (2013.01)
USPC .............. 381/120; 381/123; 381/10; 381/251

(58) Field of Classification Search
CPC .............. H03F 99/00; H03F 3/38; H03F 3/27
USPC ..................... 381/120, 123; 330/10, 251, 258
See application file for complete search history.

(56) References Cited

U.S. PATENT DOCUMENTS

| | | | | |
|---|---|---|---|---|
| 5,939,938 | A * | 8/1999 | Kalb et al. | 330/51 |
| 6,952,131 | B2 * | 10/2005 | Jeong et al. | 330/10 |
| 8,472,644 | B2 * | 6/2013 | Chen et al. | 381/120 |
| 2011/0305353 | A1 * | 12/2011 | Lang et al. | 381/120 |

* cited by examiner

*Primary Examiner* — Disler Paul
(74) *Attorney, Agent, or Firm* — Perkins Coie LLP

(57) ABSTRACT

The present technology relates generally to a closed-loop power stage and audio amplifier circuits comprising the same. The present technology further provides a method for controlling an amplifier circuit. The closed-loop power stage is configured to receive a PWM input signal having a first frequency and a first duty cycle, a power supply voltage, and a bias signal related to the power supply voltage, and to output a square-wave signal having a second frequency and a second duty cycle. The closed-loop power stage comprises a feedback loop which is configured to regulate the second duty cycle of the square-wave signal in response to a variation in the power supply voltage. The audio amplifier circuit comprising the closed-loop power stage may have a stable output voltage and thus have good power supply rejection performance.

17 Claims, 5 Drawing Sheets

AUDIO AMPLIFIER WITH CLOSED-LOOP POWER

CROSS-REFERENCE TO RELATED APPLICATION(S)

This application claims priority to and the benefit of Chinese Patent Application No. 201010198972.8, filed Jun. 11, 2010, the disclosure of which is incorporated herein by reference in its entirety.

TECHNICAL FIELD

This disclosure relates generally to power amplifiers, for example, audio amplifiers.

BACKGROUND

Audio amplifiers, especially digital audio amplifiers, are more and more popular in consumer electronics such as TV sets, automobile audios and DVD players. Conventionally, a pulse width modulated (PWM) input power stage may be configured as an output stage of a digital audio amplifier. However, traditional PWM input power stages typically have an open-loop configuration. FIG. 1 schematically illustrates a conventional single-ended audio amplifier 100 that includes an output power stage 101 configured to receive a PWM input signal and provide a square-wave signal; a filtering stage 102 configured to receive the square-wave signal and generate an output signal to drive a load 103 such as a speaker.

In FIG. 1, the output power stage 101 is in an half-bridge configuration, and comprises a first switching device M1, a second switching device M2 and a driving circuit 104. The first switching device M1 and the second switching device M2 are coupled in series between an input power supply Vcc and ground, and the driving circuit 104 is configured to receive the PWM input signal and to generate gate driving signals to drive the first switching device M1 and the second switching device M2.

M1 and M2 are turned on and off periodically in a complementary manner such that a square-wave signal $A_{SW}$ is provided at a common node SW of the switches M1 and M2. The square-wave signal $A_{SW}$ is subsequently filtered by the filtering stage 102 and an output signal OUT1 is generated and provided to the speaker 103. In the audio amplifier 100 shown in FIG. 1, the filtering stage 102 comprises a low-pass filtering inductor $L_1$, a low-pass filtering capacitor $C_1$ and an output DC-blocking capacitor $C_{OUT1}$. Since the output power stage 101 is in an open-loop configuration, the square-wave signal $A_{SW}$ may have a duty cycle that changes based on a duty cycle of the PWM input signal. When the input power supply voltage Vcc changes, the output signal OUT1 may change accordingly. The gain of the single-ended audio amplifier 100 may vary with the input power supply voltage Vcc. Thus, the single-ended audio amplifier 100 may have a poor power supply rejection performance and a low power supply rejection ratio ("PSRR").

For an audio amplifier with a bridge tied load ("BTL") that is generally configured based on two output power stages in half-bridge and open loop configurations, with zero input, the BTL audio amplifier may have differential output signals. Therefore, output voltage ripples in the differential output signals caused by a variation in a power supply voltage of the BTL audio amplifier may be counteracted. Thus, the BTL audio amplifier with an open loop configuration may have a good power supply rejection performance. However, a BTL audio amplifier with open loop configuration may not be able to provide a stable output voltage during a transient phase of a power supply voltage of the BTL audio amplifier.

DETAILED DESCRIPTION

Various embodiments of the present technology will now be described. In the following description, some specific details, such as example circuits and example values for these circuit components, are included to provide a thorough understanding of embodiments of the technology. One skilled in the relevant art will recognize, however, that the technology can be practiced without one or more specific details, or with other methods, components, materials, etc. In other instances, well-known structures, materials, or operations are not shown or described in detail to avoid obscuring aspects of the technology.

Figure 2:
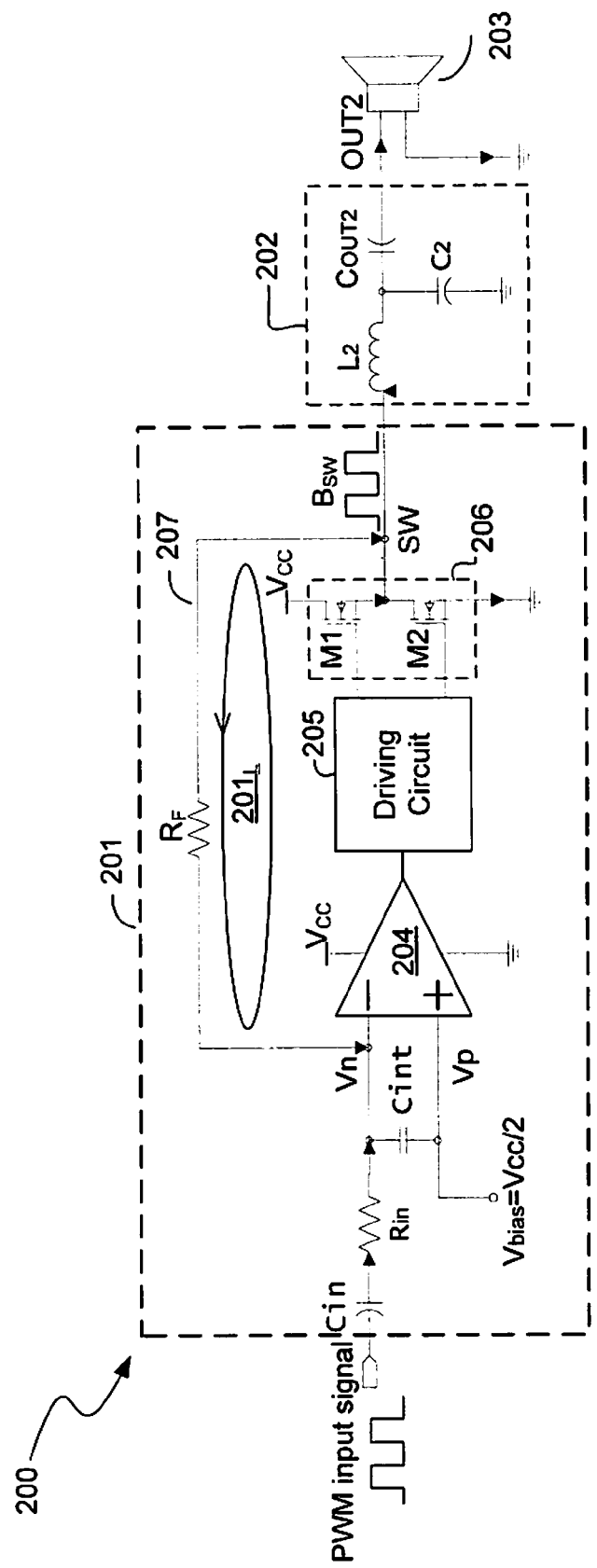
FIG. 2 is a schematic diagram of a single-ended audio amplifier circuit with a closed-loop power stage in accordance with embodiments of the present technology.

FIG. 2 is a schematic diagram of a single-ended amplifier circuit 200 in accordance with embodiments of the present technology. As shown in FIG. 2, the audio amplifier circuit 200 comprises: a closed-loop output power stage 201 having a first input terminal, a second input terminal, a third input terminal, and an output terminal. The first input terminal is configured to receive a PWM input signal having a first frequency and a first duty cycle, the second input terminal is configured to receive a bias signal $V_{bias}$, the third input terminal is configured to receive a power supply voltage $V_{CC}$, and the bias signal $V_{bias}$ is related to the power supply voltage $V_{CC}$. Based on the PWM input signal, the bias signal $V_{bias}$ and the power supply voltage $V_{CC}$, the output terminal is configured to output a square-wave signal $B_{SW}$ having a second frequency and a second duty cycle.

The audio amplifier circuit 200 also includes a filtering stage 202 coupled to the closed-loop power stage 201 to receive the square-wave signal $B_{SW}$ and a load 203 coupled to the filtering stage 202 to receive the output signal OUT2. The filtering stage 202 is configured to the square-wave signal $B_{SW}$ to provide an output signal OUT2. The closed-loop power stage 201 comprises a feedback circuit 207 configured between the output terminal and the first input terminal of the closed-loop power stage 201 to form a feedback loop $201_L$ to regulate the second duty cycle of the square-wave signal $B_{SW}$ in response to a variation in the power supply voltage $V_{CC}$.

In one embodiment, the second frequency substantially follows the first frequency except when the second duty cycle of the square-wave signal $B_{SW}$ is approximately 100% or approximately 0%. In one embodiment, the bias signal $V_{bias}$ may be proportional to the power supply voltage $V_{CC}$. In the embodiment shown in FIG. 2, the bias signal $V_{bias}$ is approximately half of the power supply voltage Vcc, i.e., $V_{bias}$=Vcc/2.

In one embodiment, the closed-loop output power stage 201 may further comprise a comparator 204 configured to receive the PWM input signal at a first comparator input terminal, to receive the bias signal $V_{bias}$ at a second comparator input terminal, and to output a comparison signal at an comparator output terminal based on the PWM input signal and the bias signal $V_{bias}$; a capacitor $C_{int}$ coupled between the first comparator input terminal and the second comparator input terminal; a driving circuit 205 configured to receive the comparison signal at a driving circuit input terminal, and to generate a driving signal at a driving circuit output terminal based on the comparison signal; and a switching circuit 206 configured to receive the driving signal at a first switching circuit input terminal, to receive the power supply voltage $V_{cc}$ at a second switching circuit input terminal, and to output the square-wave signal $B_{SW}$ at a switching circuit output terminal SW based on the driving signal and the power supply voltage $V_{CC}$; and the feedback circuit 207 is coupled between the switching circuit output terminal SW and the first comparator input terminal to form the feedback loop $201_L$.

In such a closed-loop configuration, both the PWM input signal and the square-wave signal $B_{SW}$ may control the charge/discharge of the capacitor $C_{int}$. In one embodiment, a first charge/discharge rate of the capacitor $C_{int}$ as controlled by the PWM input signal may be set larger than a second charge/discharge rate of the capacitor $C_{int}$ as controlled by the square-wave signal $B_{SW}$. In another embodiment, a first charge/discharge current to the capacitor $C_{int}$ as controlled by the PWM input signal may be set larger than a second charge/discharge current to the capacitor $C_{int}$ as controlled by the square-wave signal $B_{SW}$.

In one embodiment, a voltage at the first input terminal of the comparator 204 $V_n$ is higher than a voltage at the second input terminal of the comparator 204 $V_p$, the comparison signal changes logic state (e.g., from high to low), causing the square-wave signal $B_{SW}$ to change logic state as well (e.g., from low to high); when $V_n$ is lower than $V_p$, the comparison signal changes logic state again (e.g., from low to high), causing the square-wave signal $B_{SW}$ to change logic state again (e.g., from high to low).

In one embodiment, the switching circuit 206 may comprise a first switching device M1 and a second switching device M2. The first switching device M1 and the second switching device M2 each have a first terminal, a second terminal and a control terminal; and the first terminal of the first switching device M1 is coupled to the power supply voltage $V_{CC}$, the second terminal of the first switching device M1 is coupled to the first terminal of the second switching device M2 to form the output terminal SW. The second terminal of the second switching device M2 is coupled to ground and the control terminal of the first switching device M1 and the control terminal of the second switching device M2 are coupled to the output terminal of the driving circuit 205 to receive the driving signal. The first switching device M1 and the second switching device M2 are complementarily driven to be turned ON/OFF by the driving signal so that the square-wave signal $B_{SW}$ is generated at the output terminal SW.

In one embodiment, the driving circuit output terminal may comprise a first driving circuit output terminal and a second driving circuit output terminal. The driving signal may comprise a first driving signal and a second driving signal respectively output from the first driving circuit output terminal and the second driving circuit output terminal, and the control terminal of the first switching device M1 is coupled to the first driving signal and the control terminal of the second switching device M2 is coupled to the second driving signal. In one embodiment, the first switching device M1 and the second switching device M2 may comprise MOSFETs. In other embodiments, the switches M1 and M2 may comprise other controllable switching devices, such as BJT and IGBT.

Figure 1:
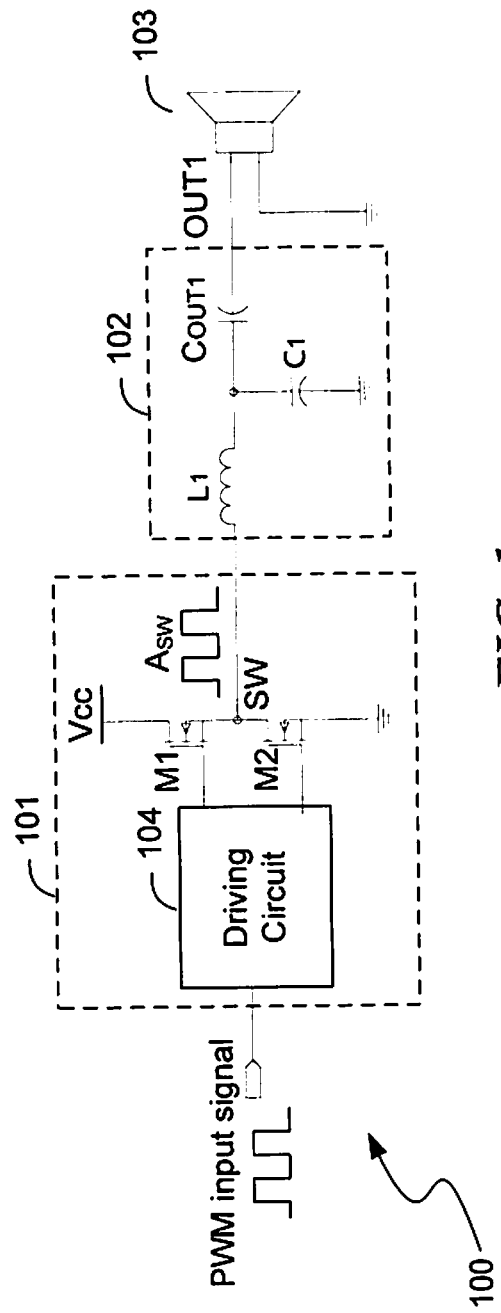
FIG. 1 is a schematic diagram of a conventional single-ended audio amplifier circuit in accordance with the prior art.

In one embodiment, the filtering stage 202 may comprise a low-pass filtering inductor $L_2$, a low-pass filtering capacitor $C_2$ and a DC blocking output capacitor $C_{OUT2}$ which are configured as in FIG. 1. In other embodiments, filtering stage 202 may comprise other components and/or in other types of configurations. In one embodiment, the feedback circuit 207 may comprise a feedback resistor $R_F$. In other embodiments, the feedback circuit 206 may comprise other feedback elements.

In one embodiment, the closed-loop power stage 201 may further comprise an input capacitor $C_{in}$, and an input resistor $R_{in}$ coupled in series between the first input terminal of the closed-loop power stage 201 and the first input terminal of the comparator 204. The PWM input signal is coupled to the first input terminal of the comparator 204 via the input capacitor $C_{in}$ and the input resistor $R_{in}$.

In one embodiment, the first comparator input terminal may comprise an inverse input terminal, and the second comparator input terminal may comprise a non-inverse input terminal, as shown in FIG. 2. In other embodiment, the first comparator input terminal may comprise a non-inverse input terminal, and the second comparator input terminal may comprise an inverse input terminal.

In FIG. 2, both the PWM input signal and the square-wave signal $B_{SW}$ can control the charge/discharge of the capacitor $C_{int}$ respectively via the input resistor $R_{in}$ and the feedback resistor $R_F$. The charge/discharge rate of the capacitor $C_{int}$ as controlled by the PWM input signal may be set to be larger than a charge/discharge rate of the capacitor $C_{int}$ as controlled by the square-wave signal $B_{SW}$ by properly choosing a resistance of the input resistor $R_{in}$ and a resistance of the feedback resistor $R_F$.

Figure 3:
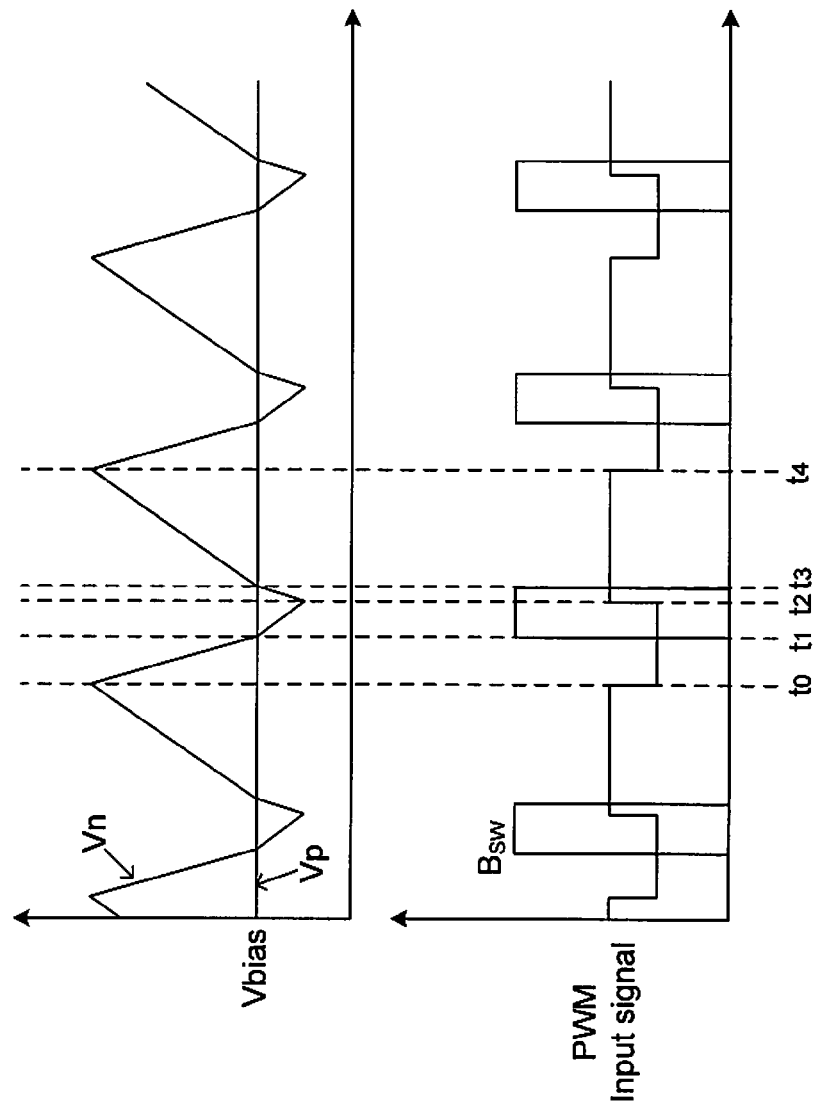
FIG. 3 illustrates an operating waveform of the audio amplifier circuit of FIG. 2.

FIG. 3 illustrates an operating waveform of the audio amplifier circuit 200 in FIG. 2. In the following, the working principle of the audio amplifier circuit 200 with a closed-loop output power stage in accordance with various embodiments of the present technology will be described with reference to FIG. 2 and FIG. 3. As shown in FIG. 3, during an operating cycle, the audio amplifier circuit 200 may comprise the following four operation stages:

Stage 1: Time Interval t0-t1

At time t0, the PWM input signal may change from high to low, while the square-wave signal $B_{SW}$ at the output terminal SW remains low. Thus, during this stage, the PWM input signal and the square-wave signal $B_{SW}$ both discharge the capacitor $C_{int}$ resulting in the voltage $V_n$ at the first input terminal of the comparator 204 decreasing.

Stage 2: Time Interval t1-t2

At time t1, the voltage $V_n$ at the first input terminal of the comparator 204 may decrease to be lower than the voltage $V_p$ at the second input terminal of the comparator 204, i.e., $V_n < V_p$. Thus, the comparison signal from the comparator 204 changes its logic state (e.g., from low to high), causing the square-wave signal $B_{SW}$ at the output terminal SW to change to high. In this case, the PWM input signal is still discharging the capacitor $C_{int}$ while the square-wave signal starts to charge the capacitor $C_{int}$. However, since the discharging rate of the capacitor $C_{int}$ as controlled by the PWM input signal is higher than the charging rate of the capacitor $C_{int}$ as controlled by the square-wave signal $B_{SW}$, the voltage $V_n$ at the first input terminal of the comparator 204 is actually decreasing at a slower rate during this stage than in prior stage.

Stage 3: Time Interval t2-t3

At time t2, the PWM input signal may change to high. Thus, both the PWM input signal and the square-wave signal $B_{SW}$ charge the capacitor $C_{int}$ during this stage, and the voltage $V_n$ at the first input terminal of the comparator 204 increases.

Stage 4: Time Interval t3-t4

At time t3, the voltage $V_n$ at the first input terminal of comparator 204 is charged to be higher than the voltage $V_p$ at the second input terminal of comparator 204. Therefore, the comparison signal output from the comparator 204 changes logic state again (from high to low), resulting in the square-wave signal $B_{SW}$ changing to low. In this case, the PWM signal is still charging the capacitor $C_{int}$, while the square-wave signal $B_{SW}$ is discharging the capacitor $C_{int}$. Since the charging rate of the capacitor $C_{int}$ as controlled by the PWM input signal is higher than the discharging rate of the capacitor $C_{int}$ as controlled by the square-wave signal $B_{SW}$, the voltage $V_n$ at the inverse input terminal of the comparator 204 actually increases at a slower rate than in Stage 3. When the PWM input signal changes from high to low again, the single-ended audio amplifier circuit 200 enters into next operating cycle, repeating the four stages described above.

Since the charge/discharge rate of the capacitor $C_{int}$ as controlled by the PWM input signal is larger than the charge/discharge rate of the capacitor $C_{int}$ as controlled by the square-wave signal $B_{SW}$, the square-wave signal $B_{SW}$ may have a frequency that substantially follows a frequency of the PWM input signal, except when the duty cycle of the square-wave signal is approximately 100% or approximately 0%, as can be seen from FIG. 3.

In addition, in the embodiment shown in FIG. 2, since the bias voltage $V_{bias}$ is related to the power supply voltage Vcc (for example, $V_{bias}$=Vcc/2), when the power supply voltage Vcc varies, the logic state changing point of the comparison signal output from the comparator 204 also varies. The variation of the logic state changing point of the comparison signal subsequently results in a variation in the duty cycle of the square-wave signal $B_{SW}$. The square-wave signal $B_{SW}$ with such variation in the duty cycle is then fed to the first input terminal of the comparator 204 via the feedback circuit 206, forming a closed feedback loop $201_L$. Therefore, the duty cycle of the square-wave signal $B_{SW}$ is regulated through the closed feedback loop $201_L$, to maintain the voltage-level stability of the output signal OUT2. The gain of the audio amplifier circuit 200 may also be adjusted by adjusting a ratio between the feedback resistor $R_F$ and the input resistor $R_{in}$, i.e. $R_F/R_{in}$.

In the above descriptions, a single-ended audio amplifier circuit with a closed-loop power stage 201 configured as its output stage is disclosed. Those skilled in the art should understand that a closed-loop power stage such as the closed-loop power stage 201 in accordance with the present technology can also be used in other types of audio amplifier circuits.

Figure 4:
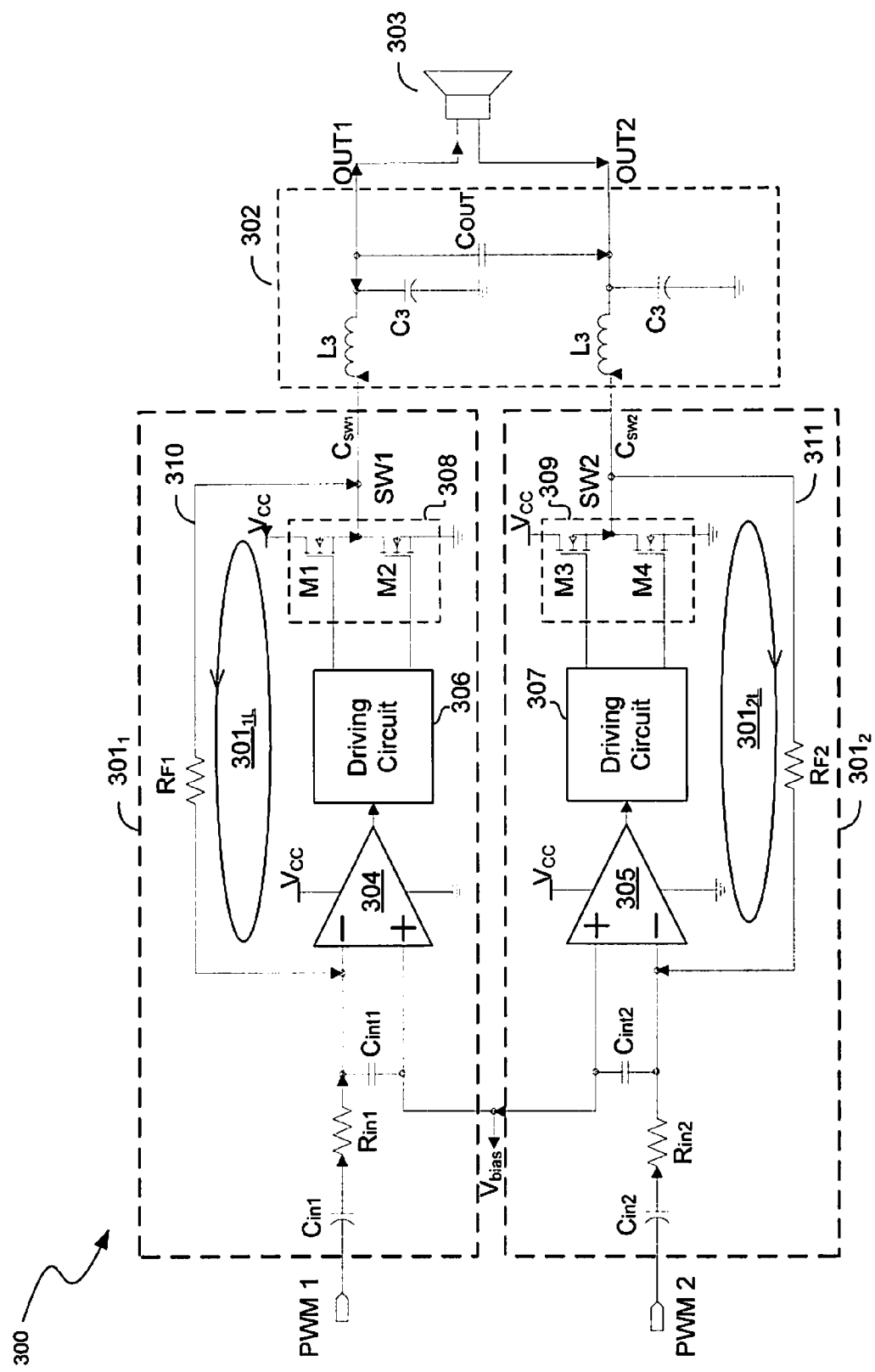
FIG. 4 is a schematic diagram of a BTL audio amplifier circuit with a closed-loop power stage in accordance with embodiments of the present technology.

FIG. 4 illustrates a schematic diagram of a BTL audio amplifier circuit 300 with a closed-loop power stage in accordance with embodiments of the present technology. The BTL audio amplifier circuit 300 comprises: a first closed-loop output power stage $301_1$, a second closed-loop output power stage $301_2$, a filtering stage 302 and a load 303. The working principle of the audio amplifier circuit 300 is generally similar to that of the audio amplifier circuit 200. The first closed-loop output power stage $301_1$ and the second closed-loop output power stage $301_2$ may have similar configuration as the closed-loop output power stage 201.

In one embodiment, the first closed-loop output power stage $301_1$ and the second closed-loop output power stage $301_2$ each comprise a first input terminal, a second input terminal, a third input terminal and an output terminal; wherein the first input terminal, the second input terminal and the third input terminal of the first closed-loop power stage $301_1$ are configured to respectively receive a first PWM input signal PWM1 having a first frequency and a first duty cycle, a bias signal $V_{bias}$ and a power supply voltage $V_{CC}$. The output terminal of the first closed-loop power stage $301_1$ is configured to output a first square-wave signal $C_{SW1}$ having a second frequency and a second duty cycle based on the first PWM input signal PWM1, the bias signal $V_{bias}$ and the power supply voltage $V_{CC}$.

The first input terminal, the second input terminal and the third input terminal of the second closed-loop power stage $301_2$ are configured to respectively receive a second PWM input signal PWM2 having a third frequency and a third duty cycle, the bias signal $V_{bias}$ and the power supply voltage $V_{CC}$, and the output terminal of the second closed-loop power stage $301_2$ is configured to output a second square-wave signal $C_{SW2}$ having a fourth frequency and a fourth duty cycle based on the second PWM input signal PWM2, the bias signal $V_{bias}$ and the power supply voltage $V_{CC}$. The bias signal $V_{bias}$ is related to the power supply voltage $V_{CC}$. The bias signal $V_{bias}$ is related to the power supply voltage $V_{CC}$.

The first closed-loop power stage $301_1$ further comprises a first feedback circuit 310 configured between the output terminal and the first input terminal of the first closed-loop power stage $301_1$ to form a first feedback loop $301_{1L}$ to regulate the second duty cycle of the first square-wave signal $C_{SW1}$ in response to a variation in the power supply voltage $V_{CC}$. The second closed-loop power stage $301_2$ further comprises a second feedback circuit 311 configured between the output terminal and the first input terminal of the second closed-loop power stage to form a second feedback loop $301_{2L}$ to regulate the fourth duty cycle of the second square-wave signal $C_{SW2}$ in response to the variation in the power supply voltage $V_{CC}$.

The filtering stage 302 is configured to receive the first square-wave signal $C_{SW1}$ and the second square-wave signal $C_{SW2}$, and to filter the first and the second square-wave signals $C_{SW1}$ and $C_{SW2}$ to respectively generate a first output signal OUT1 and a second output signal OUT2. The load 303 is configured to receive the first output signal OUT1 at a first terminal and to receive the second output signal OUT2 at a second terminal, wherein the load 303 is driven by the differential signal of the first and the second output signals OUT1 and OUT2.

In one embodiment, the second frequency of the first square-wave signal $C_{SW1}$ and the fourth frequency of the second square-wave signal $C_{SW2}$ respectively generally follow the first frequency of the first PWM input signal PWM1 and the third frequency of the second PWM input signal PWM2, except when the second duty cycle of the first square-wave signal $C_{SW1}$ and the fourth duty cycle of the second square-wave signal $C_{SW2}$ are approximately 100% or approximately 0%. In one embodiment, the bias voltage $V_{bias}$ may be proportional to the power supply voltage $V_{CC}$. In the embodiment of FIG. 4, the bias voltage $V_{bias}$ may be half of the power supply voltage $V_{CC}$, i.e. $V_{bias}$=Vcc/2.

In one embodiment, the filtering stage 302 may comprise two low-pass filtering circuits, each composed of a filtering inductor $L_3$ and a filtering capacitor $C_3$, and a bridge tied capacitor $C_{OUT}$ configured as shown in FIG. 4. In other embodiments, the filtering stage 302 may comprise other filtering circuits.

In one embodiment, the first closed-loop power stage may further comprise a first comparator 304 having a first input terminal configured to receive the first PWM input signal PWM1, a second input terminal configured to receive the bias signal $V_{bias}$, and an output terminal configured to output a first comparison signal; a first capacitor $C_{int1}$ coupled between the first input terminal and the second input terminal of the first comparator 304; a first driving circuit 306 having an input terminal configured to receive the first comparison signal, and an output terminal configured to generate a first driving signal based on the first comparison signal; and a first switching circuit 308 having a first input terminal configured to receive the first driving signal, a second input terminal configured to receive the power supply voltage $V_{CC}$, and an output terminal SW1 configured to output the first square-wave signal $C_{SW}$, based on the first driving signal and the power supply voltage Vcc; the first feedback circuit 310 is coupled between the output terminal SW1 of the first switching circuit 308 and the first input terminal of the first comparator 304 to form the first feedback loop $301_L$.

In one embodiment, similar to the first closed-loop power stage $301_1$, the second closed-loop power stage $301_2$ may further comprise a second comparator 305 having a first input terminal configured to receive the second PWM input signal PWM2, a second input terminal configured to receive the bias signal $V_{bias}$, and an output terminal configured to output a second comparison signal; a second capacitor $C_{int2}$ coupled between the first input terminal and the second input terminal of the second comparator 305; a second driving circuit 307 having an input terminal configured to receive the second comparison signal, and an output terminal configured to generate a second driving signal based on the second comparison signal; and a second switching circuit 309 having a first input terminal configured to receive the second driving signal, a second input terminal configured to receive the power supply voltage $V_{CC}$, and an output terminal SW2 configured to output the second square-wave signal $C_{SW2}$ based on the second driving signal and the power supply voltage $V_{CC}$; the second feedback circuit 311 is coupled between the output terminal SW2 of the second switching circuit 309 and the first input terminal of the second comparator 305 to form the second feedback loop $301_{2L}$.

In such closed-loop configurations, for the first closed-loop power stage $301_1$, both the first PWM input signal PWM1 and the first square-wave signal $C_{SW}$, may control the charge/discharge of the first capacitor $C_{int1}$; for the second closed-loop power stage $301_2$, both the second PWM input signal PWM2 and the second square-wave signal $C_{SW2}$ may control the charge/discharge of the second capacitor $C_{int2}$. In one embodiment, a first charge/discharge rate of the first capacitor $C_{int1}$ as controlled by the first PWM input signal PWM1 may be set larger than a second charge/discharge rate of the first capacitor $C_{int1}$ as controlled by the first square-wave signal $C_{SW1}$; similarly, a first charge/discharge rate of the second capacitor $C_{int2}$ as controlled by the second PWM input signal PWM2 may be set larger than a second charge/discharge rate of the second capacitor $C_{int2}$ as controlled by the second square-wave signal $C_{SW2}$. In one embodiment, a first charge/discharge current to the first capacitor $C_{int1}$ as controlled by the first PWM input signal PWM1 may be set larger than a second charge/discharge current to the first capacitor $C_{int1}$ as controlled by the first square-wave signal $C_{SW1}$; similarly, a first charge/discharge current to the second capacitor $C_{int2}$ as controlled by the second PWM input signal PWM2 may be set larger than a second charge/discharge current to the second capacitor $C_{int2}$ as controlled by the second square-wave signal $C_{SW2}$.

In one embodiment, the first switching circuit 308 may comprise a first switching device M1 and a second switching device M2. The first switching device M1 and the second switching device M2 each has a first terminal, a second terminal and a control terminal. The first terminal of the first switching device M1 is coupled to the power supply voltage $V_{CC}$, the second terminal of the first switching device M1 is coupled to the first terminal of the second switching device M2 to form the output terminal SW1, the second terminal of the second switching device M2 is coupled to ground and the control terminal of the first switching device M1 and the control terminal of the second switching device M2 are coupled to the output terminal of the first driving circuit 306 to receive the first driving signal.

The first switching device M1 and the second switching device M2 are complementarily driven to be turned ON/OFF by the first driving signal so that the first square-wave signal $C_{SW1}$ is generated at the output terminal SW1. Similarly, the second switching circuit 309 may comprise a third switching device M3 and a fourth switching device M4, and the third switching device M3 and the fourth switching device M4 each has a first terminal, a second terminal and a control terminal. The first terminal of the third switching device M3 is coupled to the power supply voltage $V_{CC}$, the second terminal of the third switching device M3 is coupled to the first terminal of the fourth switching device M4 to form the output terminal SW2. The second terminal of the fourth switching device M4 is coupled to ground and the control terminal of the third switching device M3 and the control terminal of the fourth switching device M4 are coupled to the output terminal of the second driving circuit 307 to receive the second driving signal. The third switching device M3 and the fourth switching device M4 are complementarily driven to be turned ON/OFF by the second driving signal so that the second square-wave signal $C_{SW2}$ is generated at the output terminal SW2.

In one embodiment, the first switching device M1, the second switching device M2, the third switching device M3 and the fourth switching device M4 may comprise MOSFETs. In other embodiment, the first, second, third and fourth switching devices M1-M4 may comprise other controllable switching devices, such as BJT and IGBT. In one embodiment, the first feedback circuit 310 may comprise a first feedback resistor $R_{F1}$ and the second feedback circuit 311 may comprise a second feedback resistor $R_{F2}$. In one embodiment, the resistances of $R_{F1}$ and $R_{F2}$ are equal.

In one embodiment, as shown in FIG. 4, the first closed-loop power stage $301_1$ may further comprise a first input capacitor $C_{in1}$ and a first input resistor $R_{in1}$ coupled in series between the first input terminal of the first closed-loop power stage $301_1$ and the first input terminal of the first comparator 304, wherein the first PWM input signal PWM1 is coupled to the first input terminal of the first comparator 304 via the first input capacitor $C_{in1}$ and the first input resistor $R_{in1}$. And similarly, the second closed-loop power stage $301_2$ may further comprise a second input capacitor $C_{in2}$ and a second input resistor $R_{in2}$ coupled in series between the first input terminal of the second closed-loop power stage $301_2$ and the first input terminal of the second comparator 305, and the second PWM input signal PWM2 is coupled to the first input terminal of the second comparator 305 via the second input capacitor $C_{in2}$ and the second input resistor $R_{in2}$. In one embodiment, the capacitances of the first capacitor $C_{int1}$ and the second capacitor $C_{int2}$ are equal, the capacitances of the first input capacitor $C_{in1}$ and the second input capacitor $C_{in2}$ are also equal; further, the resistances of the first input resistor $R_{in1}$ and the second input resistor $R_{in2}$ are equal.

In one embodiment, the first input terminal of the first comparator 304 may comprise an inverse input terminal, and the second input terminal of the first comparator 304 may comprise a non-inverse input terminal, as shown in FIG. 4. In other embodiments, the first input terminal of the first comparator 304 may comprise a non-inverse input terminal, and the second input terminal of the first comparator 304 may comprise an inverse input terminal. Similarly, the first input terminal of the second comparator 305 may comprise an inverse input terminal, and the second input terminal of the second comparator 305 may comprise a non-inverse input terminal, as shown in FIG. 4. In other embodiments, the first input terminal of the second comparator 305 may comprise a non-inverse input terminal, and the second input terminal of the second comparator 305 may comprise an inverse input terminal.

In the embodiment shown in FIG. 4, the first PWM input signal PWM1 and the first square-wave signal $C_{SW1}$, charge/discharge the first capacitor $C_{int1}$ through respectively the first input resistor $R_{in1}$ and the first feedback resistor $R_{F1}$. The second PWM input signal PWM2 and the second square-wave signal $C_{SW2}$ charge/discharge the second capacitor $C_{int2}$ through respectively the second input signal $R_{in2}$ and the second feedback resistor $R_{F2}$. During an operation cycle, processes of charging/discharging the first capacitor $C_{int1}$ as controlled by the first PWM input signal PWM1 and by the first square-wave signal $C_{SW1}$ are generally similar as the processes of charging/discharging the capacitor $C_{int}$ as controlled by the PWM input signal and by the square-wave signal $B_{SW}$ in the audio amplifier circuit 200 of FIG. 2. In addition, processes of charging/discharging the second capacitor $C_{int2}$ as controlled by the second PWM input signal PWM2 and by the second square-wave signal $C_{SW2}$ are also similar as the processes of charging/discharging the capacitor $C_{int}$ as controlled by the PWM input signal and by the square-wave signal Bsw in the audio amplifier circuit 200.

Thus, the first square-wave signal $C_{SW1}$ may have a second frequency that substantially follows a first frequency of the first PWM input signal PWM1, except when the second duty cycle of the first square-wave signal $C_{SW1}$ is approximately 100% or approximately 0%. Also, the second square-wave signal $C_{SW2}$ may have a fourth frequency that substantially follows a third frequency of the second PWM input signal PWM2, except when the fourth duty cycle of the second square-wave signal $C_{SW2}$ is substantially 100% or substantially 0%.

Further, since the bias signal $V_{bias}$ is related to the power supply voltage $V_{CC}$ (for example, $V_{bias}$=Vcc/2), a variation in the power supply voltage $V_{cc}$ may result in a variation in the second duty cycle of the first square-wave signal $C_{SW1}$ and a variation in the fourth duty cycle of the second square-wave signal $C_{SW2}$. The variation in the second duty cycle of the first square-wave signal $C_{SW1}$ is subsequently fed to the first input terminal of the first comparator 304 through the first feedback circuit 310, forming a first closed feedback loop $301_{1L}$. In addition, the variation in the fourth duty cycle of the second square-wave signal $C_{SW2}$ is subsequently fed to the first input terminal of the second comparator 305 through the second feedback circuit 311, forming a second closed feedback loop $301_{2L}$. Therefore, the second duty cycle of the first square-wave signal $C_{SW1}$ and the fourth duty cycle of the second square-wave signal $C_{SW2}$ are regulated by the closed feedback loops $301_{1L}$ and $301_{2L}$. Consequently, the first output signal OUT1 and the second output signal OUT2 may have regulated and stable voltage levels and the performance of the power supply rejection of the audio amplifier circuit 300 may be improved. According to other aspects of the present technology, the gain of the audio amplifier circuit 300 may be modified by modifying a ratio between the feedback resistor and the input resistor, supposing that $R_{in1}$=$R_{in2}$, $R_{F1}$=$R_{F2}$.

Figure 5:
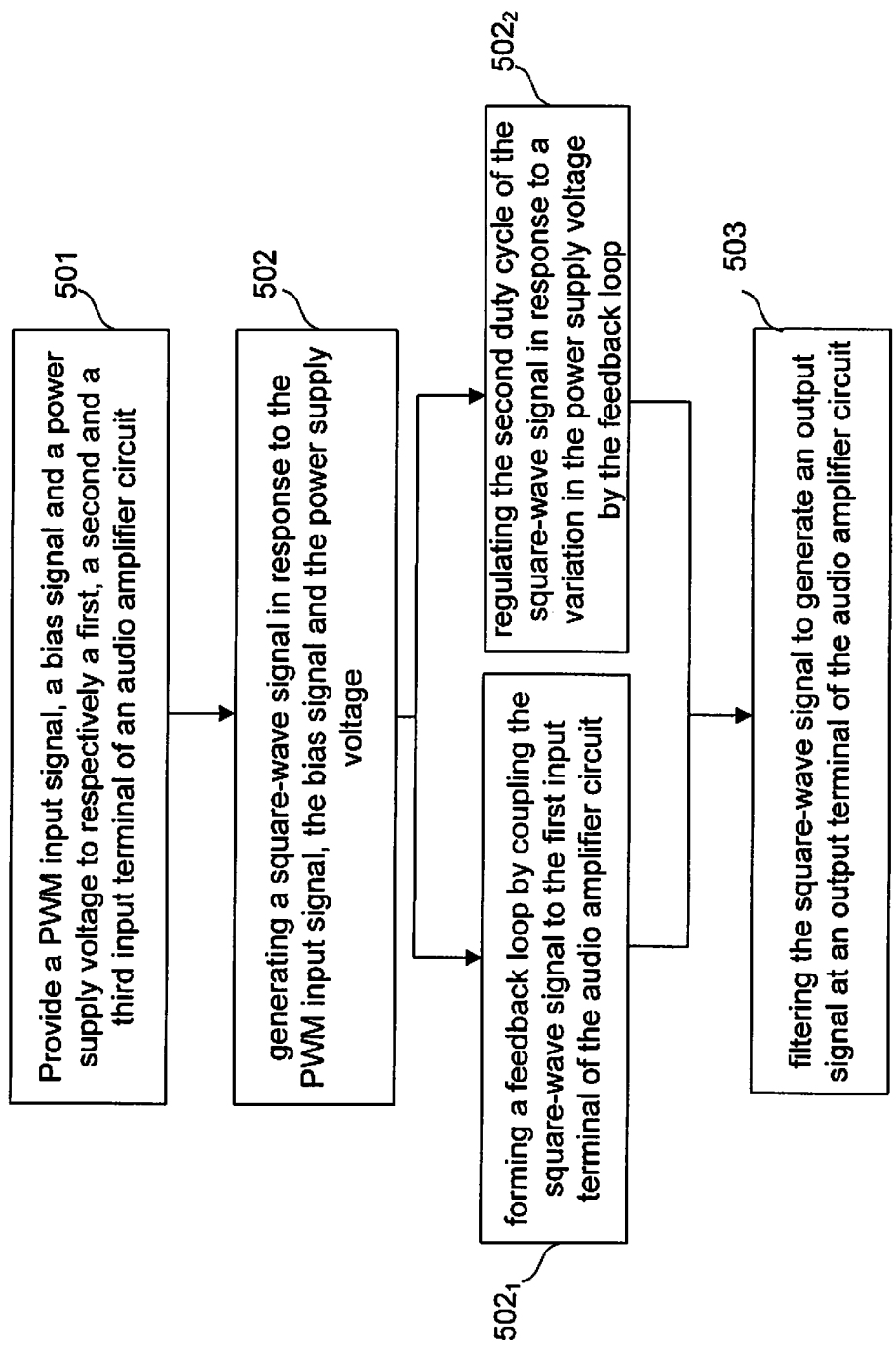
FIG. 5 illustrates a method for controlling an audio amplifier in accordance with embodiments of the present technology.

FIG. 5 illustrates a method for controlling an audio amplifier circuit in accordance with embodiments of the present technology. The method comprises: providing a PWM input signal having a first frequency and a first duty cycle, a power supply voltage and a bias signal related to the power supply voltage to respectively a first input terminal, a second input terminal and a third input terminal of the audio amplifier circuit at operation 501; generating a square-wave signal having a second frequency and a second duty cycle in response to the PWM input signal, the bias signal and the power supply voltage at operation 502; and filtering the square-wave signal to generate an output signal at an output terminal of the audio amplifier circuit at operation 503, wherein the operation 502 comprises forming a feedback loop by coupling the square-wave signal to the first input terminal of the audio amplifier circuit at operation $502_1$; and regulating the second duty cycle of the square-wave signal in response to a variation in the power supply voltage by the feedback loop at operation $502_2$.

In one embodiment, the operation 502 further comprises: integrating the PWM input signal and the square-wave signal into a capacitor to get an integrated signal; comparing the integrated signal with the bias signal to generate a comparison signal; generating a driving signal in response to the comparison signal; and generating the square-wave signal in response to the driving signal and the power supply voltage by a switching circuit.

From the foregoing, it will be appreciated that specific embodiments of the technology have been described herein for purposes of illustration, but that various modifications may be made without deviating from the technology. Many of the elements of one embodiment may be combined with other embodiments in addition to or in lieu of the elements of the other embodiments. Accordingly, the technology is not limited except as by the appended claims.

We claim:
1. A closed-loop power stage, comprising:
a first input terminal configured to receive a PWM input signal, wherein the PWM input signal has a first frequency and a first duty cycle;
a second input terminal configured to receive a bias signal;
a third input terminal configured to receive a power supply voltage, wherein the bias signal is related to the power supply voltage;
an output terminal configured to output a square-wave signal having a second frequency and a second duty cycle based on the PWM input signal, the bias signal, and the power supply voltage; and
a feedback circuit coupled between the output terminal and the first input terminal of the closed-loop power stage to form a feedback loop, wherein the feedback loop is configured to regulate the second duty cycle of the square-wave signal in response to a variation in the power supply voltage.

2. The closed-loop power stage of claim 1, wherein the second frequency generally follows the first frequency, except when the second duty cycle of the square-wave signal is approximately 100% or approximately 0%.

3. The closed-loop power stage of claim 1, further comprising:
a comparator configured to receive the PWM input signal at a first comparator input terminal, to receive the bias signal at a second comparator input terminal, and to output a comparison signal at a comparator output terminal based on the PWM input signal and the bias signal;

a capacitor coupled between the first comparator input terminal and the second comparator input terminal;

a driving circuit configured to receive the comparison signal at a driving circuit input terminal, and to generate a driving signal at a driving circuit output terminal based on the comparison signal; and a switching circuit configured to receive the driving signal at a first switching circuit input terminal, to receive the power supply voltage at a second switching circuit input terminal, and to output the square-wave signal at a switching circuit output terminal that is based on the driving signal and the power supply voltage, wherein the feedback circuit is coupled between the switching circuit output terminal and the first comparator input terminal to form the feedback loop.

4. The closed-loop power stage of claim 3, wherein a first charge/discharge rate of the capacitor as controlled by the PWM input signal is larger than a second charge/discharge rate of the capacitor as controlled by the square-wave signal.

5. The closed-loop power stage of claim 3, further comprising an input capacitor and an input resistor coupled in series between the first input terminal of the closed-loop power stage and the first comparator input terminal, wherein the PWM input signal is coupled to the first comparator input terminal via the input capacitor and the input resistor.

6. The closed-loop power stage of claim 3, wherein the feedback circuit comprises at least a feedback resistor.

7. The closed-loop power stage of claim 6, further comprising an input resistor coupled between the first input terminal of the closed-loop power stage and the first comparator input terminal, and wherein the PWM input signal is coupled to the first comparator input terminal via the input resistor, and wherein a gain of the audio amplifier circuit is adjusted by adjusting the ratio between the feedback resistor and the input resistor.

8. An audio amplifier circuit including the closed-loop power stage as claimed in claim 1, further comprises:

a filtering stage coupled to the closed-loop power stage to receive the square-wave signal, wherein the filtering stage is configured to filter the square-wave signal to provide an output signal; and a load coupled to the filtering stage to receive the output signal.

9. An audio amplifier circuit, comprising:

a first closed-loop power stage having a first input terminal configured to receive a first PWM input signal having a first frequency and a first duty cycle; a second input terminal configured to receive a bias signal; a third input terminal configured to receive a power supply voltage; and an output terminal configured to output a first square-wave signal having a second frequency and a second duty cycle at the output terminal based on the first PWM input signal, the bias signal and the power supply voltage;

a second closed-loop power stage having a first input terminal configured to receive a second PWM input signal having a third frequency and a third duty cycle; a second input terminal configured to receive the bias signal; a third input terminal configured to receive the power supply voltage; and an output terminal configured to output a second square-wave signal having a fourth frequency and a fourth duty cycle at the output terminal based on the second PWM input signal, the bias signal and the power supply voltage;

a filtering stage coupled to the first closed-loop power stage and the second closed-loop power stage to receive the first and the second square-wave signals, wherein the filtering stage is configured to filter the first and the second square-wave signals to respectively provide a first output signal and a second output signal; and a load having a first terminal and a second terminal, wherein the load is coupled to the filtering stage to receive the first output signal at the first terminal, and to receive the second output signal at the second terminal, wherein:

the bias signal is related to the power supply voltage;

the first closed-loop power stage comprises a first feedback circuit configured between the output terminal and the first input terminal of the first closed-loop power stage to form a first feedback loop to regulate the second duty cycle of the first square-wave signal in response to a variation in the power supply voltage; and the second closed-loop power stage comprises a second feedback circuit configured between the output terminal and the first input terminal of the second closed-loop power stage to form a second feedback loop to regulate the fourth duty cycle of the second square-wave signal in response to the variation in the power supply voltage.

10. The audio amplifier circuit of claim 9, wherein the second frequency substantially follows the first frequency, and wherein the fourth frequency substantially follows the second frequency, except when the second duty cycle is approximately 100% or approximately 0% and except when the fourth duty cycle is approximately 100% or approximately 0%.

11. The audio amplifier circuit of claim 9, wherein the first closed-loop power stage further comprises:

a first comparator having a first input terminal configured to receive the first PWM input signal, a second input terminal configured to receive the bias signal, and an output terminal configured to output a first comparison signal;

a first capacitor coupled between the first input terminal and the second input terminal of the first comparator;

a first driving circuit having an input terminal configured to receive the first comparison signal, and an output terminal configured to generate a first driving signal based on the first comparison signal; and a first switching circuit having a first input terminal configured to receive the first driving signal, a second input terminal configured to receive the power supply voltage, and an output terminal configured to output the first square-wave signal based on the first driving signal and the power supply voltage, wherein:

the first feedback circuit is coupled between the output terminal of the first switching circuit and the first input terminal of the first comparator to form the first feedback loop;

the second closed-loop power stage further comprises:

a second comparator having a first input terminal configured to receive the second PWM input signal, a second input terminal configured to receive the bias signal, and an output terminal configured to output a second comparison signal;

a second capacitor coupled between the first input terminal and the second input terminal of the second comparator;

a second driving circuit having an input terminal configured to receive the second comparison signal, and an output terminal configured to generate a second driving signal based on the second comparison signal; and a second switching circuit having a first input terminal configured to receive the second driving signal, a second input terminal configured to receive the power supply voltage, and an output terminal configured to output the second square-wave signal based on the second driving signal and the power supply voltage;

the second feedback circuit is coupled between the output terminal of the second switching circuit and the first input terminal of the second comparator to form the second feedback loop.

12. The audio amplifier circuit of claim 11, wherein a first charge/discharge rate of the first capacitor as controlled by the first PWM signal is larger than a second charge/discharge rate of the first capacitor as controlled by the first square-wave signal, and a first charge/discharge rate of the second capacitor as controlled by the second PWM signal is larger than a second charge/discharge rate of the second capacitor as controlled by the second square-wave signal.

13. The audio amplifier circuit of claim 11, wherein the first closed-loop power stage further comprises a first input capacitor and a first input resistor coupled in series between the first input terminal of the first closed-loop power stage and the first input terminal of the first comparator, and wherein the first PWM input signal is coupled to the first input terminal of the first comparator via the first input capacitor and the first input resistor; and the second closed-loop power stage further comprises a second input capacitor and a second input resistor coupled in series between the first input terminal of the second closed-loop power stage and the first input terminal of the second comparator, and wherein the second PWM input signal is coupled to the second input terminal of the second comparator via the second input capacitor and the second input resistor.

14. The audio amplifier circuit of claim 11, wherein the first feedback circuit comprises at least a first feedback resistor, and wherein the second feedback circuit comprises at least a second feedback resistor.

15. The audio amplifier circuit of claim 14, wherein the first closed-loop power stage further comprises a first input resistor coupled between the first input terminal of the first closed-loop power stage and the first input terminal of the first comparator, and wherein the first PWM input signal is coupled to the first input terminal of the first comparator via the first input resistor;

the second closed-loop power stage further comprises a second input resistor coupled between the first input terminal of the second closed-loop power stage and the first input terminal of the second comparator, and wherein the second PWM input signal is coupled to the second input terminal of the second comparator via the second input resistor;

a gain of the audio amplifier circuit is adjusted by adjusting a ratio between the first feedback resistor and the first input resistor or by a ratio between the second feedback resistor and the second input resistor.

16. A method, comprising:

providing a pulse width modulation (PWM) input signal having a first frequency and a first duty cycle, a power supply voltage and a bias signal related to the power supply voltage to a first input terminal, a second input terminal and a third input terminal of an amplifier circuit, respectively;

generating a square-wave signal having a second frequency and a second duty cycle in response to the PWM input signal, the bias signal, and the power supply voltage; and filtering the square-wave signal to generate an output signal at an output terminal of the audio amplifier circuit;

wherein generating the square-wave signal comprises:

forming a feedback loop by coupling the square-wave signal to the first input terminal of the audio amplifier circuit; and regulating the second duty cycle of the square-wave signal in response to a variation in the power supply voltage by the feedback loop.

17. The method of claim 16, wherein generating the square-wave signal further comprises:

integrating the PWM input signal and the square-wave signal into a capacitor to generate an integrated signal;

comparing the integrated signal with the bias signal to generate a comparison signal;

generating a driving signal in response to the comparison signal; and generating the square-wave signal in response to the driving signal and the power supply voltage by a switching circuit.

* * * * *